United States Patent

Iwamuro et al.

(10) Patent No.: US 9,627,486 B2
(45) Date of Patent: Apr. 18, 2017

(54) SEMICONDUCTOR DEVICE

(71) Applicant: FUJI ELECTRIC CO., LTD., Kawasaki-shi, Kanagawa (JP)

(72) Inventors: Noriyuki Iwamuro, Tsukuba (JP); Yasuyuki Hoshi, Matsumoto (JP); Yuichi Harada, Matsumoto (JP); Shinsuke Harada, Tsukuba (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/397,086

(22) PCT Filed: Mar. 18, 2013

(86) PCT No.: PCT/JP2013/057745
§ 371 (c)(1),
(2) Date: Oct. 24, 2014

(87) PCT Pub. No.: WO2013/161451
PCT Pub. Date: Oct. 31, 2013

(65) Prior Publication Data
US 2015/0108501 A1    Apr. 23, 2015

(30) Foreign Application Priority Data

Apr. 27, 2012  (JP) ................. 2012-104230

(51) Int. Cl.
*H01L 29/16* (2006.01)
*H01L 29/161* (2006.01)
(Continued)

(52) U.S. Cl.
CPC ...... *H01L 29/1608* (2013.01); *H01L 29/0615* (2013.01); *H01L 29/0661* (2013.01);
(Continued)

(58) Field of Classification Search
CPC ........... H01L 29/66348; H01L 29/7397; H01L 29/7818; H01L 29/7811
(Continued)

(56) References Cited

U.S. PATENT DOCUMENTS 5,712,502 A    1/1998  Mitlehner et al.
6,002,159 A    12/1999  Bakowski et al.
(Continued)

FOREIGN PATENT DOCUMENTS

CN    102194883 A    9/2011
JP    2005-223220 A   8/2005
(Continued)

OTHER PUBLICATIONS

Notification of Transmittal of Translation of the International Preliminary Report on Patentability (Form PCT/IB/338) of International Application No. PCT/JP2013/057745 mailed Nov. 6, 2014 with Forms PCT/IB/373, PCT/ISA/237 and PCT/IB/326 (13 pages).
(Continued)

*Primary Examiner* — Kimberly Rizkallah
*Assistant Examiner* — Brian Turner
(74) *Attorney, Agent, or Firm* — Westerman, Hattori, Daniels & Adrian, LLP

(57) ABSTRACT

In an active region, p⁺ regions are selectively disposed in a surface layer of an n⁻ drift layer on an n⁺ semiconductor substrate. A p-base layer is disposed on surfaces of the n⁻ drift layer and the P⁺ regions, and an MOS structure is disposed on the p-base layer. In another portion of the active region, a p⁺ region is disposed to be in contact with the source electrode on the p⁺ regions. In a breakdown voltage structure region (100), a JTE structure having at least a P⁻ region is disposed separately from the P⁺ regions and the p-base layer, to surround the active region. The P⁻ region is electrically in contact with the P⁺ region in a portion in
(Continued)

which the MOS structure is not formed, in the vicinity of the boundary between the active region and the breakdown voltage structure region.

11 Claims, 14 Drawing Sheets

(51) Int. Cl.
| H01L 29/24 | (2006.01) |
| H01L 29/78 | (2006.01) |
| H01L 29/66 | (2006.01) |
| H01L 29/06 | (2006.01) |
| H01L 29/10 | (2006.01) |
| H01L 29/739 | (2006.01) |
| H01L 29/872 | (2006.01) |
| H01L 29/40 | (2006.01) |
| H01L 29/417 | (2006.01) |
| H01L 29/861 | (2006.01) |
| H01L 29/08 | (2006.01) |

(52) U.S. Cl.
CPC .... *H01L 29/1095* (2013.01); *H01L 29/66068* (2013.01); *H01L 29/7395* (2013.01); *H01L 29/78* (2013.01); *H01L 29/7811* (2013.01); H01L 29/0878 (2013.01); H01L 29/402 (2013.01); H01L 29/41741 (2013.01); H01L 29/8611 (2013.01); H01L 29/872 (2013.01)

(58) Field of Classification Search
USPC .............. 257/493, E29.014, 283, 341, 500
See application file for complete search history.

(56) References Cited

U.S. PATENT DOCUMENTS

| 2003/0080355 | A1* | 5/2003 | Shirai ................ H01L 29/0696 257/200 |
| 2004/0104429 | A1* | 6/2004 | Takahashi .......... H01L 29/0623 257/338 |
| 2006/0033153 | A1* | 2/2006 | Onishi ............... H01L 29/0634 257/328 |
| 2006/0231917 | A1* | 10/2006 | Ono ................... H01L 29/0634 257/500 |
| 2007/0114602 | A1* | 5/2007 | Saito .................. H01L 29/0619 257/330 |
| 2007/0170436 | A1 | 7/2007 | Sugawara |
| 2008/0050876 | A1* | 2/2008 | Matocha ............ H01L 29/0634 438/269 |
| 2008/0258211 | A1* | 10/2008 | Sugi ..................... H01L 29/408 257/330 |
| 2011/0227154 | A1 | 9/2011 | Ono et al. |
| 2011/0233714 | A1 | 9/2011 | Lu |
| 2012/0313112 | A1* | 12/2012 | Wada .................. H01L 29/045 257/77 |
| 2012/0319249 | A1* | 12/2012 | Uchida ................ H01L 29/045 257/628 |

FOREIGN PATENT DOCUMENTS

| JP | 2007-258742 A | 10/2007 |
| JP | 3997551 B2 | 10/2007 |
| JP | 2011-204710 A | 10/2011 |
| JP | 2012-33618 A | 2/2012 |

OTHER PUBLICATIONS

International Search Report dated Jun. 4, 2013 issued in corresponding application No. PCT/JP2013/057745.
Fujihira, "Theory of Semiconductor Superjunction Devices", Jpn. J. Appl. Phys., vol. 36, Part 1, No. 10, Oct. 1997, pp. 6254-6262; cited in the Specification.
Deboy et al., "A new generation of high voltage MOSFETs breaks the limit line of silicon", IEEE IEDM, 1998, 683-685; cited in the Specification.
Shenai et al., "Optimum Semiconductors for High-Power Electronics", IEEE Transactions on Electron Devices, vol. 36, 1989, pp. 1811-1823; cited in the Specification.
Temple et al., "Junction Termination Extension for Near-Ideal Breakdown Voltage in p-n Juntions", IEEE Transactions on Electron Devices, vol. ED-33, No. 10, Oct. 1986; pp. 1601-1608; cited in the Specification.
Wang et al., "Effect of Contact Resistivities and Interface Properties on the Performance of SiC Power Devices", IEEE ISPSD, 1986, pp. 303-308; cited in the Specification.
Office Action dated Aug. 2, 2016, issued in counterpart to Chinese Patent Application No. 201380021928.1, with Partial English translation. (15 pages).

* cited by examiner

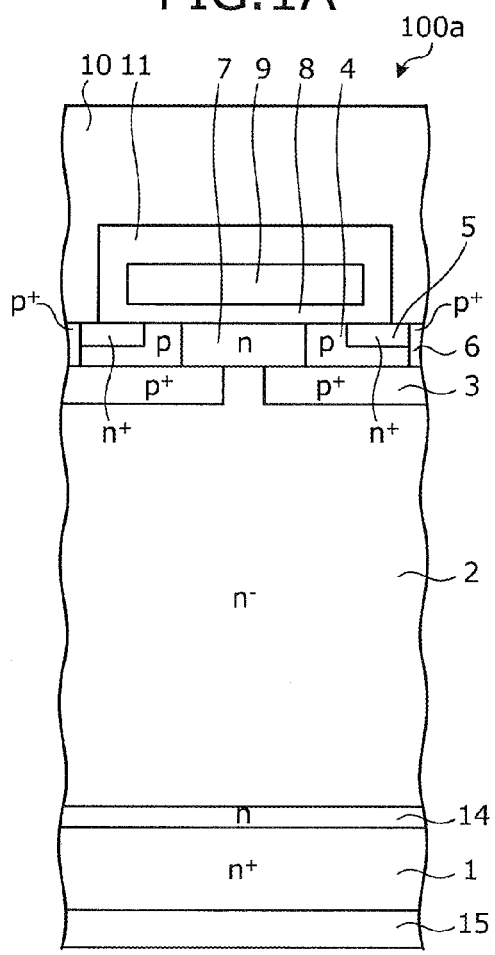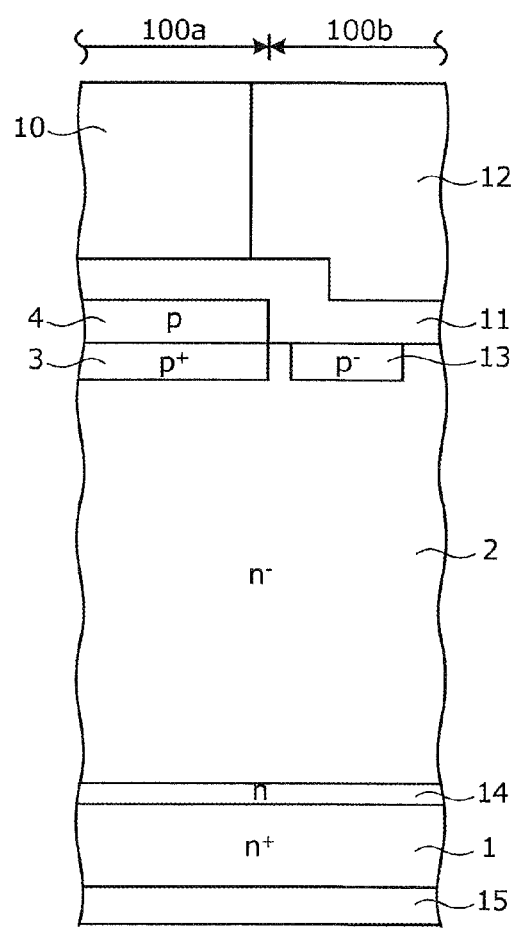

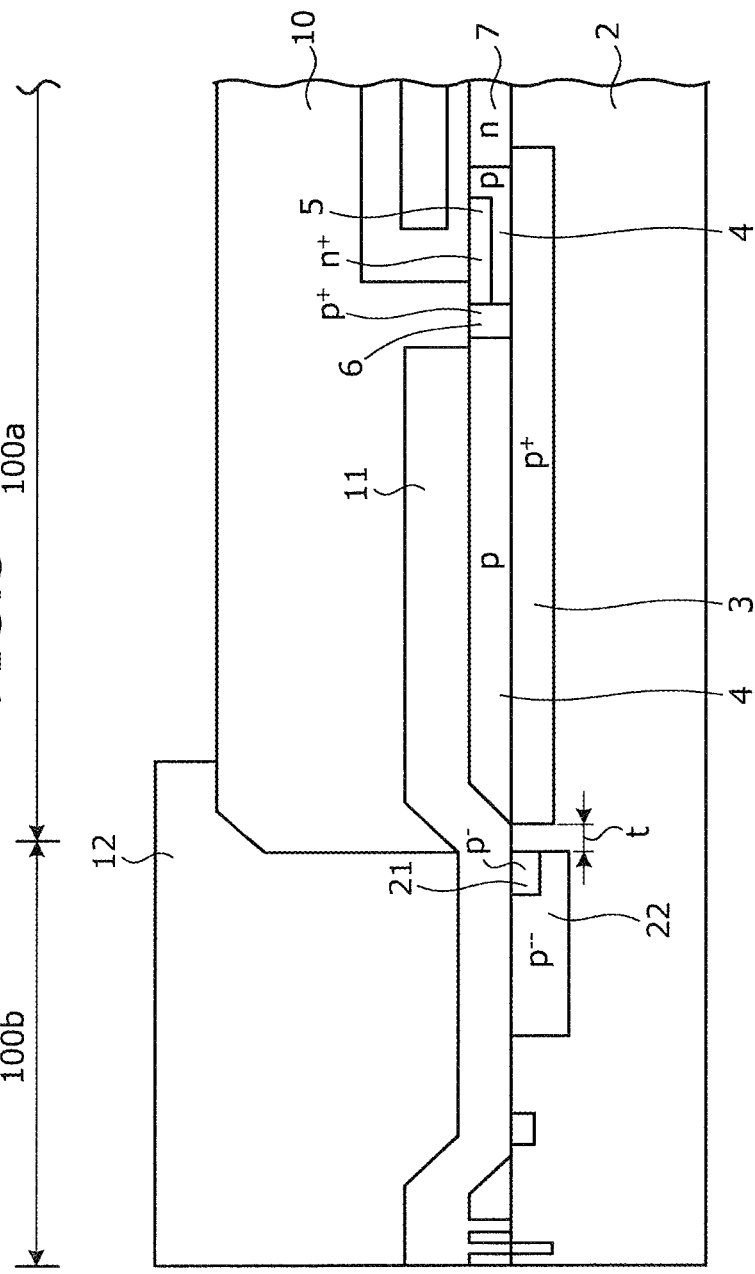

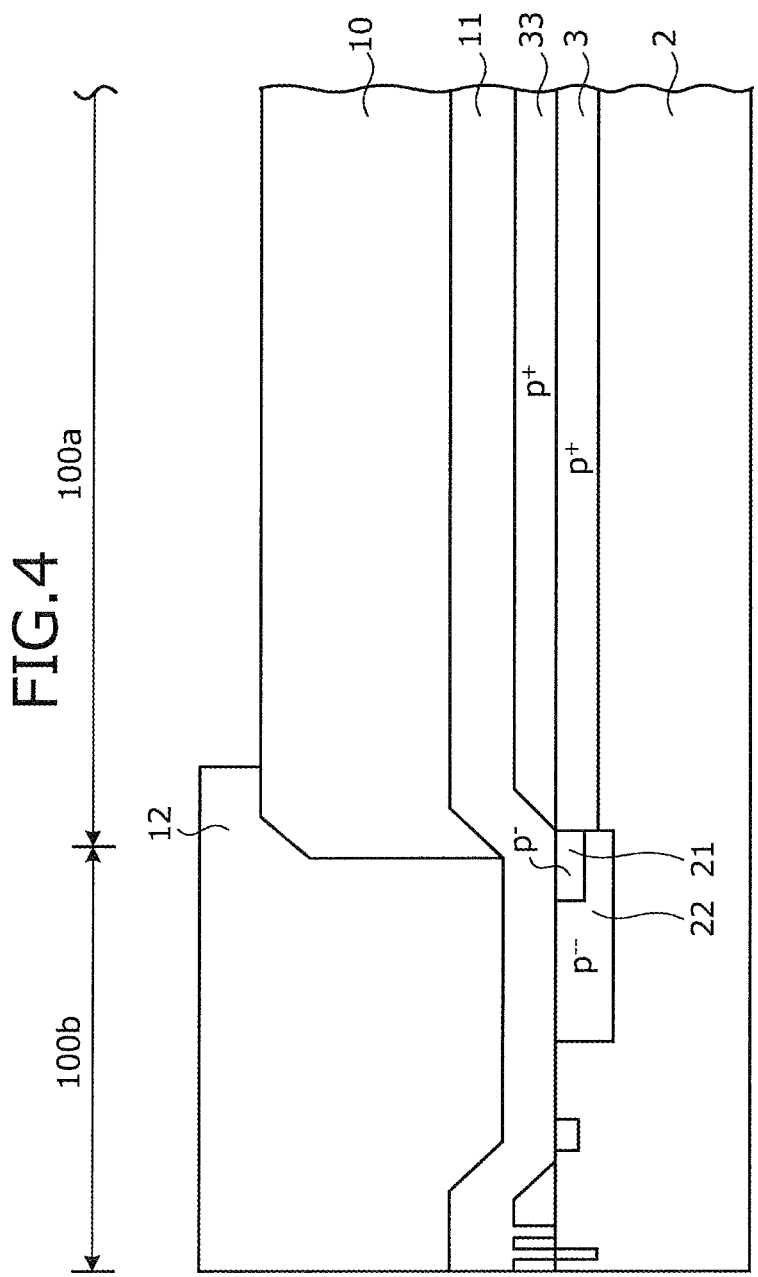

FIG.13

| | | SECOND JTE REGION (p⁻ REGION) | | | | | | | | |
|---|---|---|---|---|---|---|---|---|---|---|
| | DOSAGE | $4.0 \times 10^{12}$ cm⁻² | $6.0 \times 10^{12}$ cm⁻² | $8.0 \times 10^{12}$ cm⁻² | $1.0 \times 10^{13}$ cm⁻² | $1.2 \times 10^{13}$ cm⁻² | $1.4 \times 10^{13}$ cm⁻² | $1.6 \times 10^{13}$ cm⁻² | $1.8 \times 10^{13}$ cm⁻² | $2.0 \times 10^{13}$ cm⁻² |
| FIRST JTE REGION (p⁻⁻ REGION) | $3.0 \times 10^{13}$ cm⁻² | 1418 V | 1428 V | 1442 V | 1448 V | 1441 V | | 1422 V | | 1410 V |
| | $4.0 \times 10^{13}$ cm⁻² | | | 1438 V | 1450 V | 1442 V | | | | 1419 V |
| | $5.0 \times 10^{13}$ cm⁻² | 1440 V | 1442 V | 1448 V | 1452 V | 1447 V | 1440 V | 1435 V | 1432 V | 1425 V |
| | $6.0 \times 10^{13}$ cm⁻² | 1440 V | 1450 V | 1452 V | 1450 V | 1452 V | 1450 V | 1440 V | 1435 V | 1430 V |
| | $7.0 \times 10^{13}$ cm⁻² | 1430 V | 1435 V | 1445 V | 1452 V | 1440 V | 1441 V | 1440 V | 1432 V | 1425 V |
| | $8.0 \times 10^{13}$ cm⁻² | 1420 V | 1422 V | 1440 V | 1450 V | 1435 V | 1435 V | 1440 V | 1432 V | 1421 V |
| | $9.0 \times 10^{13}$ cm⁻² | | | 1435 V | 1440 V | 1432 V | | | | |
| | $1.0 \times 10^{14}$ cm⁻² | | | 1430 V | 1430 V | 1432 V | | | | |
| | $1.1 \times 10^{14}$ cm⁻² | | | 1422 V | 1425 V | 1421 V | | | | |
| | $1.2 \times 10^{14}$ cm⁻² | 1412 V | | 1418 V | 1420 V | 1418 V | | | | 1402 V |

FIG.14

| DOSAGE | | SECOND JTE REGION (p⁻⁻ REGION) | | | | | | | |
|---|---|---|---|---|---|---|---|---|---|
| | $4.0 \times 10^{12}$ cm⁻² | $6.0 \times 10^{12}$ cm⁻² | $8.0 \times 10^{12}$ cm⁻² | $1.0 \times 10^{13}$ cm⁻² | $1.2 \times 10^{13}$ cm⁻² | $1.4 \times 10^{13}$ cm⁻² | $1.6 \times 10^{13}$ cm⁻² | $1.8 \times 10^{13}$ cm⁻² | $2.0 \times 10^{13}$ cm⁻² |
| $3.0 \times 10^{13}$ cm⁻² | 650 V | | 1145 V | 1201 V | 1065 V | | 865 V | | 758 V |
| $4.0 \times 10^{13}$ cm⁻² | | | 1258 V | 1352 V | 1095 V | | | | 850 V |
| $5.0 \times 10^{13}$ cm⁻² | 1254 V | 1312 V | 1385 V | 1420 V | 1210 V | 1156 V | 1056 V | 995 V | 950 V |
| $6.0 \times 10^{13}$ cm⁻² | 1285 V | 1321 V | 1410 V | 1451 V | 1421 V | 1325 V | 1255 V | 1152 V | 995 V |
| $7.0 \times 10^{13}$ cm⁻² | 1115 V | 1295 V | 1352 V | 1410 V | 1395 V | 1310 V | 1158 V | 1085 V | 912 V |
| $8.0 \times 10^{13}$ cm⁻² | 1158 V | 1251 V | 1347 V | 1388 V | 1352 V | 1201 V | 1085 V | 1002 V | 845 V |
| $9.0 \times 10^{13}$ cm⁻² | | | 1263 V | 1380 V | 1252 V | | | | |
| $1.0 \times 10^{14}$ cm⁻² | | | 1153 V | 1200 V | 1165 V | | | | |
| $1.1 \times 10^{14}$ cm⁻² | | | 1075 V | 1120 V | 1065 V | | | | |
| $1.2 \times 10^{14}$ cm⁻² | 850 V | | 962 V | 1020 V | 962 V | | | | 820 V |

FIRST JTE REGION (p⁻ REGION)

SEMICONDUCTOR DEVICE

TECHNICAL FIELD

The present invention relates to a semiconductor device.

BACKGROUND ART

Silicon (Si) monocrystalline is conventionally used as constituent material for power semiconductor devices controlling high breakdown voltage and high current. The power semiconductor devices fall into several types, such as bipolar transistors, insulated gate bipolar transistors (IGBTs), metal insulator semiconductor field-effect transistors (MISFETs), Schottky barrier diodes (SBDs), and P-intrinsic-N (PiN) diodes, which are selectively used depending on the intended use.

For example, bipolar transistors and IGBTs cannot be switched at high speed although higher current density enables higher current as compared to MOSFETs. For example, the usage of bipolar transistors is limited up to a switching frequency of several kHz and the usage of IGBTs is limited up to about 20 kHz. On the other hand, power MOSFETs can be operated at high speed up to several MHz, although lower current density makes it difficult to handle higher current as compared to bipolar transistors and IGBTs.

However, since a power semiconductor device supporting both high current and high-speed performance is strongly demanded in the market, efforts have been made to improve IGBTs and power MOSFETs, which have been substantially developed closely to the material limits. Among such power semiconductor devices, a cross-sectional structure of a conventional MOSFET will be described. FIG. 17 is a cross-sectional view of a configuration of a conventional MOSFET. As depicted in FIG. 17, a conventional MOSFET has an $n^-$ drift layer 102 disposed on a front surface of an $n^+$ semiconductor substrate 101 acting as an $n^+$ drain layer, and a p-base region 103 is selectively disposed in a surface layer of the $n^-$ drift layer 102.

An $n^+$ source region 104 is selectively disposed in a surface layer of the p-base region 103. A gate electrode 106 is disposed via a gate insulation film 105 on a surface of a portion of the p-base region 103 interposed between the $n^-$ drift layer 102 and the $n^+$ source region 104. A source electrode 107 is in contact with the p-base region 103 and the $n^+$ source region 104. A drain electrode 108 is disposed on a back surface of the $n^+$ semiconductor substrate 101. Moreover, superjunction MOSFETs that have a drift layer configured as a parallel p-n layer with p-type regions and n-type regions alternately and repeatedly arranged are recently attracting attention (see Non-Patent Literatures 1 and 2).

The superjunction MOSFETs are known as being proposed as a theory by Fujihira in 1997 as described in Non-Patent Literature 1 and put into production as Cool-MOSFET by Deboy, et al. in 1998 as described in Non-Patent Literature 2. The superjunction MOSFETs are characterized in that columnar p-layers having a longitudinal shape in a substrate depth direction in the $n^-$ drift layer are arranged at predetermined intervals so as to dramatically improve ON-resistance without deterioration in breakdown voltage characteristics between source and drain.

Semiconductor materials replacing silicon are studied in terms of power semiconductor devices and silicon carbide (SiC) is attracting attention as a semiconductor material usable for producing (fabricating) a next generation power semiconductor device excellent in low ON-voltage, high-speed characteristics, and high-temperature characteristics (see Non-Patent Literature 3). This is because silicon carbide is chemically very stable semiconductor material with a wide band gap of 3 eV and can be used very stably as a semiconductor even at high temperature. Another reason is that silicon carbide has critical electric field that is ten-fold higher than silicon and therefore, can make ON-resistance sufficiently small.

As described above, silicon carbide is a semiconductor material highly likely to exceed the material limit of silicon and is, therefore, largely expected to grow in use as power semiconductors or particularly MOSFETs in the future. Among the features thereof, silicon carbide is particularly expected to achieve smaller ON-resistance, and it is expected to realize a vertical SiC-MOSFET having lower ON-resistance with high breakdown voltage characteristics maintained. A cross-sectional view of the structure of a typical vertical SiC-MOSFET is the same as that of a vertical MOS-FET using silicon as a semiconductor material and is as depicted in FIG. 17.

A vertical SiC-MOSFET formed in this way is expected to be utilized as a switching device having low ON-resistance and switchable at high speed in power conversion equipment such as an inverter for motor control and an uninterruptible power supply (UPS). However, when high voltage is applied between a source and a drain, the high voltage is applied not only to an active region through which current flows during on-time but also to an edge termination structure region that is disposed in a peripheral portion of the active region and that sustains the breakdown voltage. When high voltage is applied, the edge termination structure region has a depletion layer spreading in a lateral direction (a direction parallel to a substrate principal plane) and is, therefore, susceptible to electrical charge of the substrate surface. As a result, breakdown characteristics may become unstable.

A junction termination (JTE: Junction Termination Extension) structure is known as structure that eliminates such a problem and has a p-type region formed surrounding a corner portion of a p-base region to alleviate or disperse an electric field of the edge termination structure region for improving the breakdown voltage of the entire semiconductor device (see. e.g., Non-Patent Literatures 4 and 5), and the structure is applied also to semiconductor devices using silicon carbide as a semiconductor material (see, e.g., Patent Documents 1 to 3).

Patent Document 1: Specification of U.S. Pat. No. 6,002,159
Patent Document 2: Specification of U.S. Pat. No. 5,712,502
Patent Document 3: Publication of Japanese Patent No. 3997551
Non-Patent Literature 1: T. Fujihira, "Theory of Semiconductor Superjunctions Devices", Japanese Journal of Applied Physics, Vol. 36, Part 1, No. 10, pp. 6254-6262, 1997
Non-Patent Literature 2: G. Deboy, et al, "A New Generation of High Voltage MOSFETs Breaks the Limit Line of Silicon", IEEE International Electron devices Meeting (IEDM), (USA), December 1998, pp. 683-685
Non-Patent Literature 3: K. Shenai, et al, "Optimum Semiconductors for High-Power Electronics", IEEE Transactions on Electron Devices, vol. 36, No. 9, September 1989, pp. 1811-1823
Non-Patent Literature 4: T. K. Wang, et al, "Effect of Contact Resistivities and Interface Properties on The Performance of SiC Power Devices", IEEE International Symposium on Power Semiconductor Devices and ICs (ISPSD), 1992, pp. 303-308

Non-Patent Literature 5: V. A. K Temple, "Junction Termination Extension for Near-Ideal, Breakdown Voltage in p-n Junctions", IEEE Transactions on Electron Devices, Vol. 33, No. 10, October 1986, pp. 1601-1608

DISCLOSURE OF INVENTION

Problem to be Solved by the Invention

However, the JTE structure has a problem of considerable deterioration in breakdown voltage characteristics due to variations in impurity concentration of a p-type region formed surrounding a corner portion of a p-base region. This problem has existed ever since the structure was applied to a semiconductor device using silicon as a semiconductor material and it is presumed that the same problem occurs in a semiconductor device using silicon carbide as a semiconductor device.

It is an object of the present invention to provide a semiconductor device having a semiconductor device structure stably exhibiting high breakdown voltage characteristics so as to eliminate the problems of the conventional technique described above. It is another object of the present invention to provide a semiconductor device having low ON-resistance so as to eliminate the problems of the conventional technique described above.

Means for Solving Problem

To solve the problems above and achieve an object, a semiconductor device that has an active region disposed on a semiconductor substrate; and an edge termination structure region disposed on the semiconductor substrate to surround the active region, is characterized by the following. The active region includes a first-conductivity-type semiconductor layer disposed on the semiconductor substrate and having an impurity concentration lower than the semiconductor substrate; a first second-conductivity-type semiconductor region selectively disposed in a surface layer of the first-conductivity-type semiconductor layer, to reach a boundary between the active region and the edge termination structure region, the surface layer of the first-conductivity-type semiconductor layer being on a side opposite to the semiconductor substrate; a first electrode electrically connected to the first second-conductivity-type semiconductor region; a front surface device structure made up of at least the first second-conductivity-type semiconductor region and the first electrode; a second electrode disposed on a back surface of the semiconductor substrate; and a second second-conductivity-type semiconductor region disposed in a region excluding a region in which the front surface device structure is disposed, and formed to be in contact with the first second-conductivity-type semiconductor region and up to a boundary position between the active region and the edge termination structure region. The edge termination structure region includes a plurality of third second-conductivity-type semiconductor regions disposed in the surface layer of the first-conductivity-type semiconductor layer, separately from the boundary between the active region and the edge termination structure region and having an impurity concentration lower than the first second-conductivity-type semiconductor region, the surface layer of the first-conductivity-type semiconductor layer being on the side opposite to the semiconductor substrate. The second second-conductivity-type semiconductor region is in contact with the first electrode. Among the plurality of the third second-conductivity-type semiconductor regions, at least the third second-conductivity-type semiconductor region closest to the active region is electrically connected to the second second-conductivity-type semiconductor region in the vicinity of the boundary between the active region and the edge termination structure region.

In the invention above, the semiconductor device according to the present invention is further characterized in that the front surface device structure is further made up of: a second-conductivity-type semiconductor layer disposed on the first-conductivity-type semiconductor layer and the first second-conductivity-type semiconductor region, and having an impurity concentration lower than the first second-conductivity-type semiconductor region; a fourth first-conductivity-type semiconductor region selectively formed in a surface layer of the second-conductivity-type semiconductor layer, the surface layer of the second-conductivity-type semiconductor layer being on a side opposite to the first second-conductivity-type semiconductor region; a fifth first-conductivity-type semiconductor region penetrating the second-conductivity-type semiconductor layer in a depth direction, to the first-conductivity-type semiconductor layer; a gate electrode disposed via a gate insulation film on a surface of a portion of the second-conductivity-type semiconductor layer, the portion of the second-conductivity-type semiconductor layer being interposed between the fourth first-conductivity-type semiconductor region and the fifth first-conductivity-type semiconductor region; and the first electrode that is in contact with the fourth first-conductivity-type semiconductor region and the second-conductivity-type semiconductor layer.

In the invention above, the semiconductor device according to the present invention is further characterized in in that the plurality of the third second-conductivity-type semiconductor regions is disposed separately from the first second-conductivity-type semiconductor region and the second-conductivity-type semiconductor layer.

In the invention above, the semiconductor device according to the present invention is further characterized in in that among the plurality of the third second-conductivity-type semiconductor regions, at least the third second-conductivity-type semiconductor region closest to the active region has an end portion that faces the active region and is separated by a distance of 20 μm or less from an end portion of the first second-conductivity-type semiconductor region, the end portion of the first second-conductivity-type semiconductor region facing the edge termination structure region.

In the invention above, the semiconductor device according to the present invention is further characterized in in that among the plurality of the third second-conductivity-type semiconductor regions, at least the third second-conductivity-type semiconductor region closest to the active region has an end portion that faces the active region and is separated by a distance of 20 μm or less from an end portion of the second-conductivity-type semiconductor layer, the end portion of the second-conductivity-type semiconductor layer facing the edge termination structure region.

In the invention above, the semiconductor device according to the present invention is further characterized in in that the second-conductivity-type semiconductor layer is an epitaxial layer formed by an epitaxial growth method.

In the invention above, the semiconductor device according to the present invention is further characterized in in that the first-conductivity-type semiconductor layer is an epitaxial layer formed by an epitaxial growth method.

In the invention above, the semiconductor device according to the present invention is further characterized in in that the first second-conductivity-type semiconductor region, the fourth first-conductivity-type semiconductor region, and the fifth first-conductivity-type semiconductor region are impurity diffusion regions formed by an ion implantation method.

In the invention above, the semiconductor device according to the present invention is further characterized in in that the semiconductor substrate is made of silicon carbide.

In the invention above, the semiconductor device according to the present invention is further characterized in in that a front surface of the semiconductor substrate is parallel to a (000-1) plane or a plane tilted by 10 degrees or less relative to the (000-1) plane.

In the invention above, the semiconductor device according to the present invention is further characterized in in that a front surface of the semiconductor substrate is parallel to a (0001) plane or a plane tilted by 10 degrees or less relative to the (0001) plane.

According to the invention described above, when at least the third second-conductivity-type semiconductor region closest to the active region among the multiple third second-conductivity-type semiconductor regions is brought into contact with the second second-conductivity-type semiconductor region only in a portion not provided with a front surface device structure, such as portions under a gate pad and gate runners, in the vicinity of a boundary between the active region and the edge termination structure region, high breakdown voltage characteristics can be acquired stably without affecting the breakdown voltage from impurity concentration and structure of the first second-conductivity-type semiconductor region and the second-conductivity-type semiconductor layer of the active region regardless of variations in impurity concentration of the multiple third second-conductivity-type semiconductor regions making up the JTE structure. Therefore, even if the breakdown voltage determined by the JTE structure is reduced due to variations in impurity concentration of the multiple third second-conductivity-type semiconductor regions, the breakdown voltage can be determined by p-n junction of the first second-conductivity-type semiconductor region and the second-conductivity-type semiconductor layer of the active region with the first-conductivity-type semiconductor layer, and a high breakdown voltage can be maintained.

According to the present invention, since the second-conductivity-type semiconductor layer is formed by an epitaxial growth method, the surface of the second-conductivity-type semiconductor layer can be made substantially flat without surface roughness and, therefore, the channel mobility can be made extremely high in a MOS structure portion made up of the second-conductivity-type semiconductor layer, the gate insulation film, and the gate electrode. According to the present invention, even when silicon carbide is used as a semiconductor material, the principal plane of the semiconductor substrate can be set to a plane parallel to the (000-1) plane, a plane tilted by 10 degrees or less relative to the (000-1) plane, a plane parallel to the (0001) plane, or a plane tilted by 10 degrees or less relative to the (0001) plane, so as to reduce the interface state density at the interface between the gate insulation film and the silicon carbide semiconductor. As a result, the channel mobility can further be improved in the MOS structure portion.

Effect of the Invention

The semiconductor device according to the present invention produces an effect that enables the provision of a semiconductor device having a device structure stably exhibiting high breakdown voltage characteristics. The semiconductor device according to the present invention also produces an effect that enables the provision of a semiconductor device having low ON-resistance.

BRIEF DESCRIPTION OF DRAWINGS

FIGS. 1A and 1B are cross-sectional views of a configuration of a semiconductor device according to a first embodiment;

FIG. 3 is a cross-sectional view of structure along cut lines A-A' and B-B' of FIG. 2;

FIG. 4 is a cross-sectional view along a cut line C-C' of FIG. 2;

FIG. 13 is a table of breakdown voltage characteristics of a SiC-MOSFET according to the first embodiment;

FIG. 14 is a table of breakdown voltage characteristics of a SiC-MOSFET of a comparison example;

BEST MODE(S) FOR CARRYING OUT THE INVENTION

Figure 2:
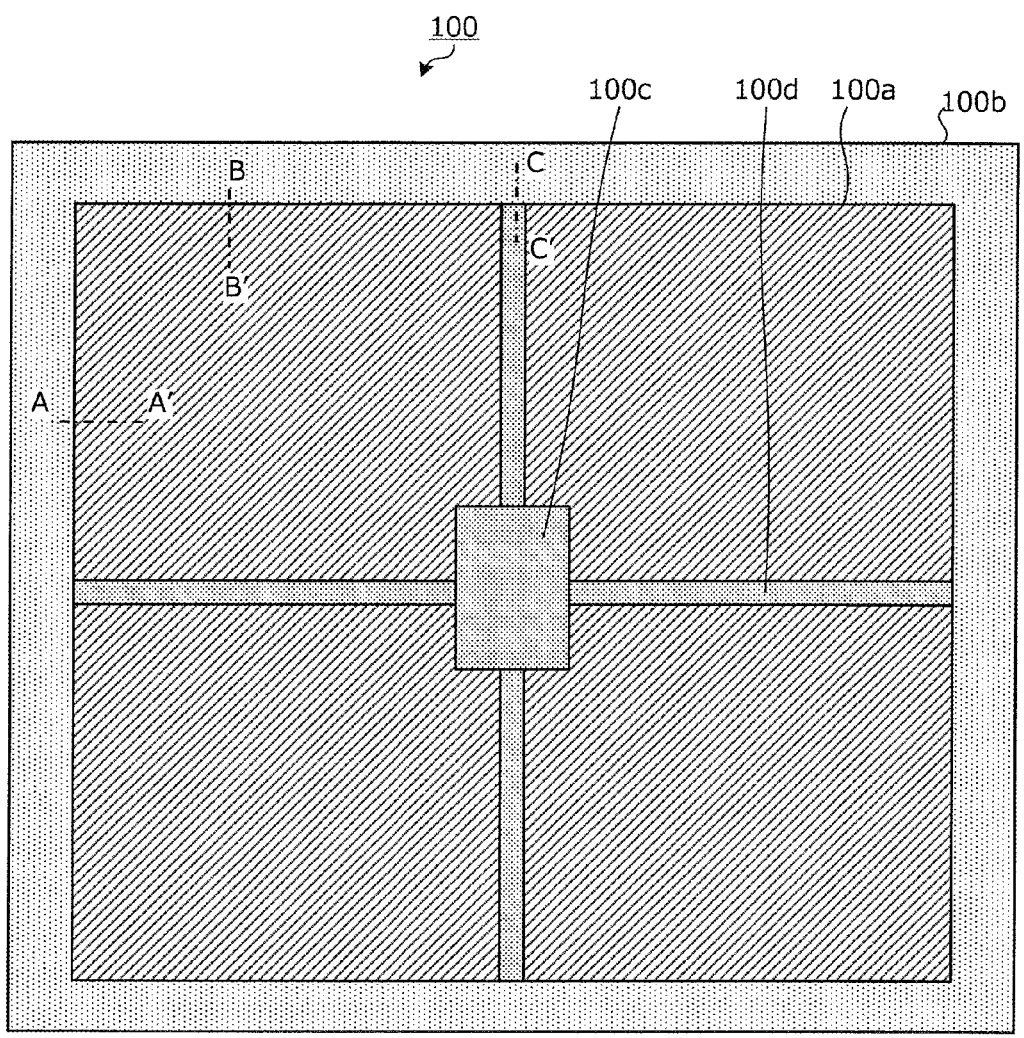
FIG. 2 is a plane view of a configuration of the semiconductor device according to the first embodiment.

Preferred embodiments of a semiconductor device according to the present invention will now be described in detail with reference to the accompanying drawings. In this description and the accompanying drawings, layers and regions prefixed with n or p mean that majority carriers are electrons or positive holes, respectively. Additionally, + and − added to n or p mean that impurity concentration is higher and lower, respectively, than layers and regions without + and −. In the following description of the embodiments and the accompanying drawings, the same constituent elements are denoted by the same reference numerals and will not repeatedly be described. In this description, when Miller indices are described, "−" means a bar added to an index immediately after the "−", and a negative index is represented by prefixing "−" to the index.

First Embodiment

A semiconductor device according to a first embodiment will be described by taking as an example a SiC-MOSFET in vertical planar gate structure using silicon carbide (SiC) as a semiconductor material. FIGS. 1A and 1B are cross-sectional views of a configuration of the semiconductor device according to the first embodiment. FIG. 1A depicts cross-sectional structure of one element structure in an active region 100a through which current flows during on-time. Although not depicted, the active region 100a has the element structures depicted in FIG. 1A, in plural, arranged in parallel. FIG. 1B schematically depicts cross-sectional structure of a breakdown voltage structure region 100b surrounding an outermost peripheral portion of the active region 100a and retaining breakdown voltage (hereinafter, the same applies to FIGS. 5A to 12B).

As depicted in FIGS. 1A and 1B, the semiconductor device according to the first embodiment has an n$^-$ drift layer (first-conductivity-type semiconductor layer) 2 having an epitaxial layer deposited on a front surface of an n$^+$ semiconductor substrate 1 acting as an n$^+$ drain layer made of silicon carbide. In the active region 100a, P$^+$ regions (first second-conductivity-type semiconductor regions) 3 are selectively disposed in a surface layer of the n$^-$ drift layer 2 on the side opposite to the n$^+$ semiconductor substrate 1. The P$^+$ region 3 closest to the edge termination structure region 100b is disposed such that an end portion facing the edge termination structure region 100b reaches the boundary between the active region 100a and the edge termination structure region 100b. Therefore, the P$^+$ regions 3 are not disposed in the edge termination structure region 100b.

The P$^+$ regions 3 have, for example, a hexagonal or rectangular (hereinafter, referred to as cellular) plane shape and have a planar layout in which the multiple P$^+$ regions 3 are arranged in a matrix shape, for example. The P$^+$ regions 3 may have a striped planar layout extended in a direction orthogonal to the direction of arrangement of the multiple P$^+$ regions 3. A p-base layer (second-conductivity-type semiconductor layer) 4 having an epitaxial layer is deposited on surfaces of the n$^-$ drift layer 2 and the P$^+$ regions 3. The p-base layer 4 is disposed such that an end portion facing the edge termination structure region 100b reaches the boundary between the active region 100a and the edge termination structure region 100b. A portion of the p-base layer 4 on the P$^+$ region 3 has an n$^+$ source region (fourth first-conductivity-type semiconductor region) 5 and a P$^+$ contact region 6 selectively provided in a surface layer on the opposite side to the P$^+$ region 3.

The P$^+$ contact region 6 is disposed on the side of the n$^+$ source region 5 opposite to an n-well region 7 described later and is in contact with the n$^+$ source region 5. In a portion of the p-base layer 4 on the n$^-$ drift layer 2, the n-well region (fifth first-conductivity-type semiconductor region) 7 is disposed penetrating the p-base layer 4 in the depth direction and reaching the n$^-$ drift layer 2. A gate electrode 9 is disposed via a gate insulation film 8 on a surface of a portion of the p-base layer 4 interposed between the n$^+$ source region 5 and the n-well region 7. A source electrode (input electrode) 10 is in contact with the n$^+$ source region 5 and the P$^+$ contact region 6. The source electrode 10 is electrically insulated from the gate electrode 9, by an interlayer insulation film 11.

In the edge termination structure region 100b, on a surface layer on the side of the n$^-$ drift layer 2 opposite to the n$^+$ semiconductor substrate 1, one or more P$^-$ regions (third second-conductivity-type semiconductor regions) are disposed having impurity concentration lower than the P$^+$ regions 3 to surround the active region 100a and make up a JTE structure 13. The JTE structure 13 has a portion in contact with the P$^+$ regions 3 (or a P$^+$ region 33 described later, or the both regions) (not depicted) and the remaining larger portion is separated from the P$^+$ regions 3 and the p-base layer 4. The interlayer insulation film 11 is disposed on the JTE structure 13. The JTE structure 13 will be described later in detail.

An end portion of the source electrode 10 is covered by a passivation film 12. An n-layer 14 is disposed between the n$^+$ semiconductor substrate 1 and the n$^-$ drift layer 2 to be in contact with the n$^+$ semiconductor substrate 1 and the n$^-$ drift layer 2. The impurity concentration of the n-layer 14 is higher than the impurity concentration of the n$^-$ drift layer 2 and lower than the impurity concentration of the n$^+$ semiconductor substrate 1. The n-layer 14 acts as a field stop (FS) layer suppressing spread of a depletion layer. A back surface electrode (second electrode) 15 acting as a drain electrode is disposed on the back surface of the n$^+$ semiconductor substrate 1.

A configuration of the JTE structure 13 will be described in detail with reference to FIGS. 2 to 4. FIG. 2 is a plane view of a configuration of the semiconductor device according to the first embodiment. FIG. 3 is a cross-sectional view along cut lines A-A' and B-B' of FIG. 2. FIG. 4 is a cross-sectional view along a cut line C-C' of FIG. 2. FIG. 2 depicts a planar layout of the active region 100a and the edge termination structure region 100b. FIG. 3 depicts the cross-sectional structure when the P$^+$ regions 3 having a cellular plane shape are arranged in a matrix shape and the same cross-sectional structure is formed along the cut lines A-A' and B-B'.

As depicted in FIG. 2, the active region 100a is located at a center portion of a semiconductor chip 100, for example. The edge termination structure region 100b is disposed in an outer peripheral portion of the semiconductor chip 100 to surround a peripheral portion of the active region 100a. The semiconductor chip 100 is formed by depositing the n$^-$ drift layer 2 on an epitaxial layer, on the front surface of the n$^+$ semiconductor substrate 1. FIG. 2 depicts a planar layout of the active region 100a and the edge termination structure region 100b viewed from the n$^-$ drift layer 2. In the vicinity of the center portion of the semiconductor chip 100, a gate pad and gate runners are disposed above the n$^-$ drift layer 2, i.e., on the source electrode 10, across a thick insulation film (not depicted).

The gate pad is disposed in the center portion of the semiconductor chip 100, for example. The gate pad is electrically connected via the gate runner to the gate electrode 9. The gate pad is an aluminum electrode exposing a portion to which a bonding wire for leading out the gate electrode 9 is connected. The gate runners are connected to the gate pad and are linearly arranged from the gate pad to the edge termination structure region 100b. The gate runners are aluminum electrode wires transmitting gate signals from the gate pad to the gate electrodes 9.

The active region 100a is divided into multiple parts by a portion 100c under the gate pad and portions 100d under the gate runners. In FIG. 3, the active region 100a is divided into four parts by the portion 100c under the gate pad and the portions 100d under the gate runners. Each part of the divided active region 100a is provided with multiple MOS (insulation gate having metal/oxide film/semiconductor) structures (front-surface device structures) having the n+ source regions 5, the P+ contact regions 6, the n-well regions 7, the gate insulation films 8, and the gate electrodes 9.

On the other hand, no MOS structure is formed in the portion 100c under the gate pad and the portions 100d under the gate runners. In the portion 100c under the gate pad and in the portions 100d under the gate runners, a p+ region (second second-conductivity-type semiconductor region) 33 is disposed penetrating the p-base layer 4 in the depth direction to the P+ regions 3. The p+ region 33 has the same plane shape as the portion 100c under the gate pad and the portions 100d under the gate runners and has, for example, a linear plane shape from the portion 100c under the gate pad to a boundary position between the active region 100a and the edge termination structure region 100b. A portion of the P+ region 33 is in contact with the source electrode 10 (not depicted). The P+ region 33 is a contact region in contact with a P− region 21 and the source electrode 10 making up a JTE structure described later.

As depicted in FIGS. 3 and 4, in the edge termination structure region 100b, the p− region 21 and a p−− region 22 are disposed in a surface layer of the n− drift layer 2 on the opposite side to the n+ semiconductor substrate 1 to make up a JTE structure. The p− region 21 is disposed on the side closest to the active region 100a and surrounds the active region 100a. The impurity concentration of the p− region 21 is lower than the impurity concentration of the p-base layer 4. The p−− region 22 is disposed at a position more distant from the active region 100a as compared to the p− region 21 and surrounds the p− region 21. The p−− region 22 is in contact with the p− region 21 and covers a region of the lower side (the side facing the n+ semiconductor substrate 1) of the p− region 21. The impurity concentration of the p−− region 22 is lower than the impurity concentration of the p− region 21.

As depicted in FIG. 3, the p− region 21 and the p−− region 22 are disposed separately from the P+ region 3 and the p-base layer 4. On the boundary between the active region 100a and the edge termination structure region 100b, a distance t between an end portion of the p− region 21 (the end portion facing the active region 100a) and end portions of the P+ region 3 and the p-base layer 4 (the end portions facing the edge termination structure region 100b) is preferably equal to or less than 20 μm, for example. This allows the effects of the present invention to notably appear.

On the other hand, as depicted in FIG. 4, in the portion 100c under the gate pad and the portions 100d under the gate runners in the vicinity of the boundary between the active region 100a and the edge termination structure region 100b, the end portion of the p− region 21 (the end portion facing the active region 100a) is in contact with the end portion of the P+ region 3 or the P+ region 33, or the end portions of the both regions. Since the p− region 21 is electrically connected via one or both of the P+ region 3 and the P+ region 33 to the source electrode 10, the electrical potential is stabilized during operation of the semiconductor device. In the portion 100c under the gate pad and the portions 100d under the gate runners in the vicinity of the boundary between the active region 100a and the edge termination structure region 100b, the end portion of the p−− region 22 (the end portion facing the active region 100a) may be in contact with the end portion of the P+ region 3 or the P+ region 33, or the end portions of the both regions.

Figure 5A:
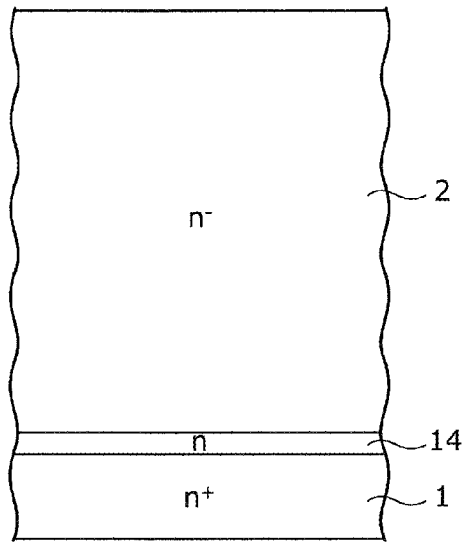
FIGS. 5A and 5B are cross-sectional views of a state during fabrication of the semiconductor device according to the first embodiment.
Figure 5B:
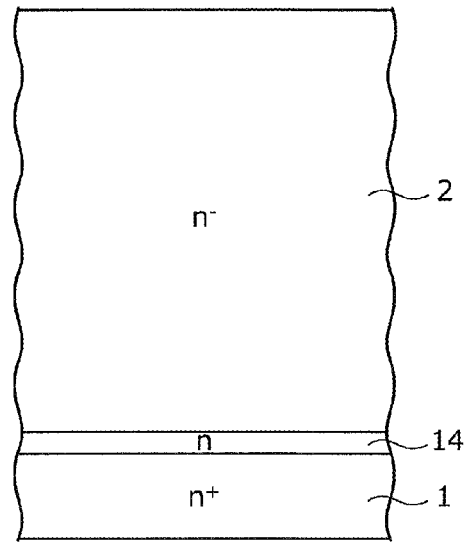

A method of fabricating the semiconductor device according to the first embodiment will be described. FIGS. 5A, 5B, 6A, 6B, 7A, 7B, 8A, 8B, 9A, 9B, 10A, 10B, 11A, 11B, 12A, and 12B are cross-sectional views of states during fabrication of the semiconductor device according to the first embodiment. For example, the case of producing (fabricating) a SiC-MOSFET having a rated current of 25 A and a breakdown voltage of 1200 V will be taken as an example in this description. First, as depicted in FIGS. 5A and 5B, the n+ semiconductor substrate 1 having silicon carbide (SiC) is prepared. The n+ semiconductor substrate 1 is a low-resistance silicon carbide monocrystal substrate having about $2 \times 10^{19}$ cm$^{-3}$ of nitrogen (N) as impurities, for example. The n+ semiconductor substrate 1 is a silicon carbide monocrystal substrate having four-layer cycle hexagonal crystals of silicon carbide (4H—SiC), for example.

The n+ semiconductor substrate 1 has a principal plane that is a (000-1) C-plane having an off-angle of about 4 degrees in a <11-20> direction, for example. On the principal plane (front surface) of the n+ semiconductor substrate 1, the n-layer 14 acting as the field stop layer is formed by an epitaxial growth method or ion implantation method. On the n-layer 14 of the n+ semiconductor substrate 1, the n− drift layer 2 is epitaxially grown to a thickness of about 10 μm, for example. The n− drift layer 2 may be epitaxially grown such that about $1.8 \times 10^{16}$ cm$^{-3}$ of nitrogen is present as impurities, for example.

Figure 6A:
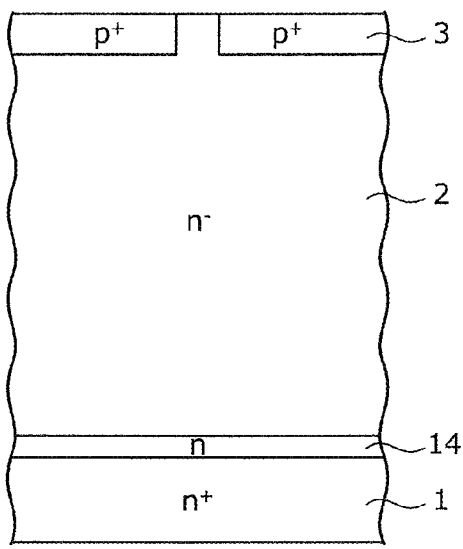
FIGS. 6A and 6B are cross-sectional views of a state during fabrication of the semiconductor device according to the first embodiment.
Figure 6B:
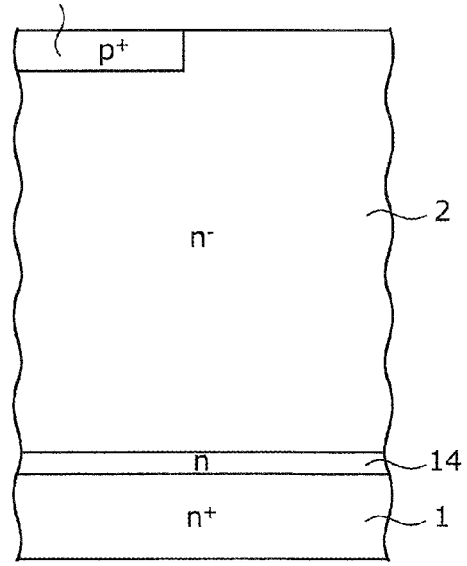

As depicted in FIGS. 6A and 6B, the P+ regions 3 are selectively formed to, for example, a depth of about 0.5 μm, in the surface layer of the n− drift layer 2 of the active region by ion implantation. In this ion implantation, for example, aluminum may be used as a dopant and a dosage may be set such that an impurity concentration of $1.0 \times 10^{18}$ cm$^{-3}$ is achieved in the P+ regions 3. A width between the adjacent P+ regions 3 may be 2 μm, for example. A width of the P+ region 3 in the direction of alignment of the multiple P+ regions 3 may be about 13 μm, for example.

Figure 7A:
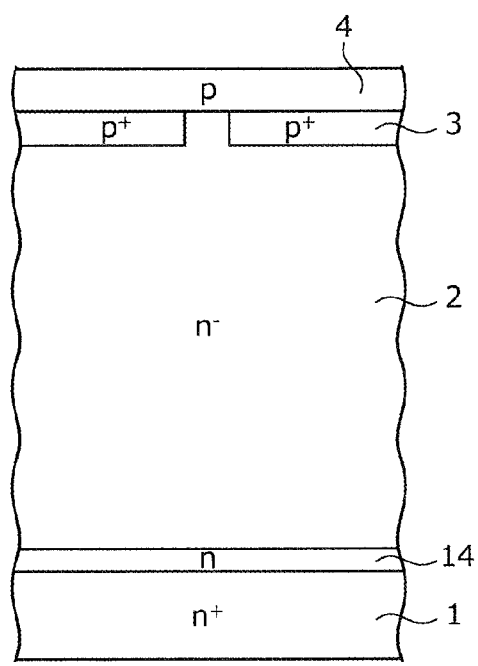
FIGS. 7A and 7B are cross-sectional views of a state during fabrication of the semiconductor device according to the first embodiment.
Figure 7B:
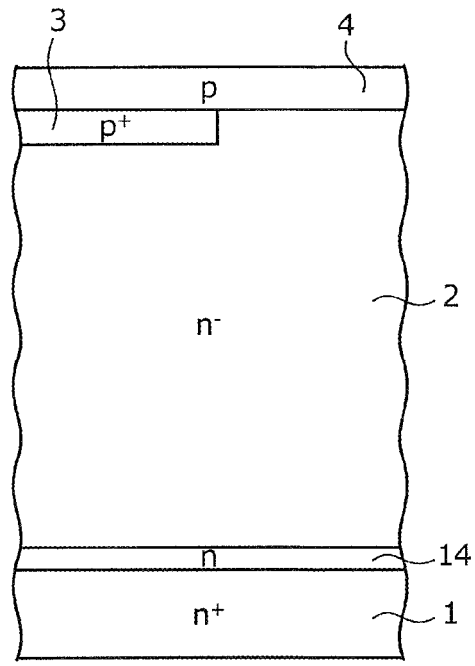
Figure 8A:
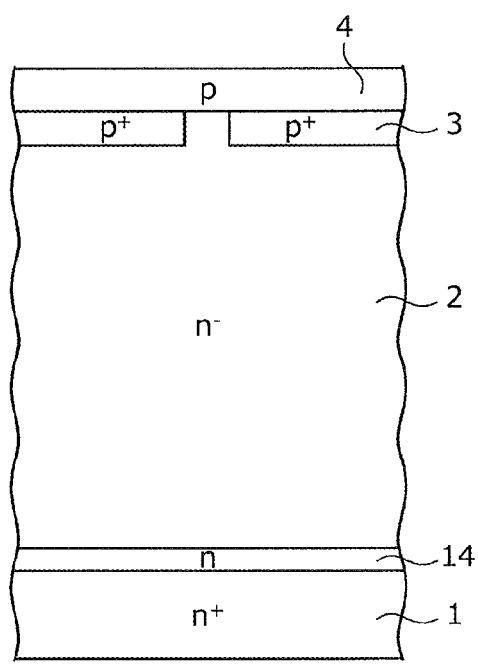
FIGS. 8A and 8B are cross-sectional views of a state during fabrication of the semiconductor device according to the first embodiment.
Figure 8B:
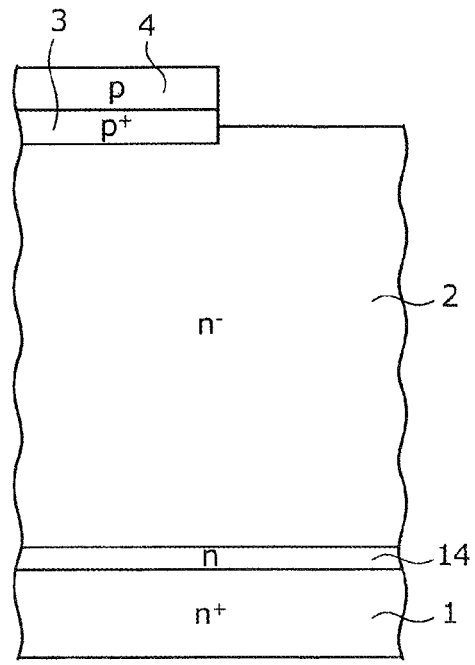

As depicted in FIGS. 7A and 7B, the p-base layer 4 is epitaxially grown to, for example, a thickness of 0.5 μm, on the surfaces of the n− drift layer 2 and the P+ regions 3 across the active region and the edge termination structure region. In this epitaxial growth, for example, aluminum may be used as impurities and an introduction amount of impurities may be set such that an impurity concentration of $2.0 \times 10^{16}$ cm$^{-3}$ is achieved in the p-base layer 4. As depicted in FIGS. 8A and 8B, in the edge termination structure region, a portion of the p-base layer 4 is etched by, for example, a depth of 0.7 μm to expose the n− drift layer 2. As a result, a bevel structure is formed in the edge termination structure region and end portions of the P+ region 3 and the p-base layer 4 are exposed.

Figure 9A:
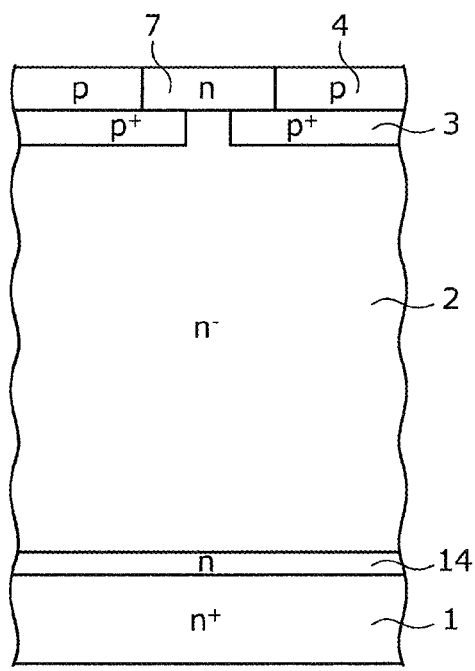
FIGS. 9A and 9B are cross-sectional views of a state during fabrication of the semiconductor device according to the first embodiment.
Figure 9B:
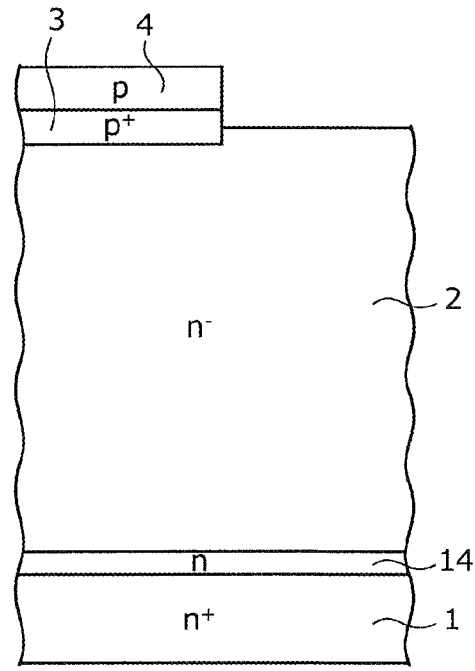

As depicted in FIGS. 9A and 9B, the conductivity type of a portion of the p-base layer 4 on the n− drift layer 2 is inverted by ion implantation to form the n-well region 7 penetrating the p-base layer 4 in the depth direction and reaching the n− drift layer 2. In this ion implantation, for example, nitrogen may be used as a dopant and the dosage may be set such that an impurity concentration of $5.0 \times 10^{16}$ cm$^{-3}$ is achieved in the n-well region 7. The depth of the n-well region 7 may be a depth allowing the n-well region 7 to be disposed within the n− drift layer 2. The depth and width of the n-well region 7 may be 1.5 μm and 20 μm, respectively.

Figure 10A:
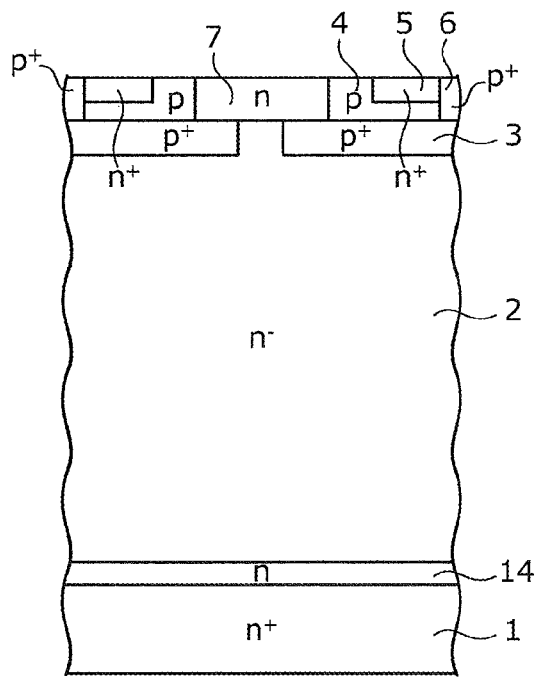
FIGS. 10A and 10B are cross-sectional views of a state during fabrication of the semiconductor device according to the first embodiment.
Figure 10B:
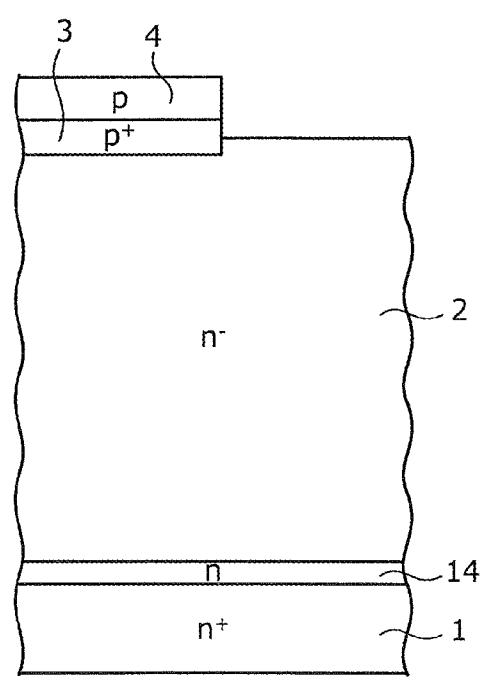

As depicted in FIGS. 10A and 10B, the n+ source regions 5 and the P+ contact regions 6 are respectively selectively formed by the ion implantation method in the surface layers of portions of the p-base layer 4 on the P+ regions 3. The p+ region 33 is formed at the same time with the P+ contact regions 6 in the portion 100c under the gate pad and the portions 100d under the gate runners of the p-base layer 4.

The P⁺ contact regions 6 and the p⁺ region 33 are formed to penetrate the p-base layer 4 in the depth direction and came in to contact with the n⁻ drift layer 2. The order of formation of the n⁺ source regions 5, the P⁺ contact regions 6, and the n-well region 7 may variously be changed. Activation annealing is then performed. The activation annealing may be performed at a temperature of 1620 degrees C. for two minutes, for example.

Figure 11A:
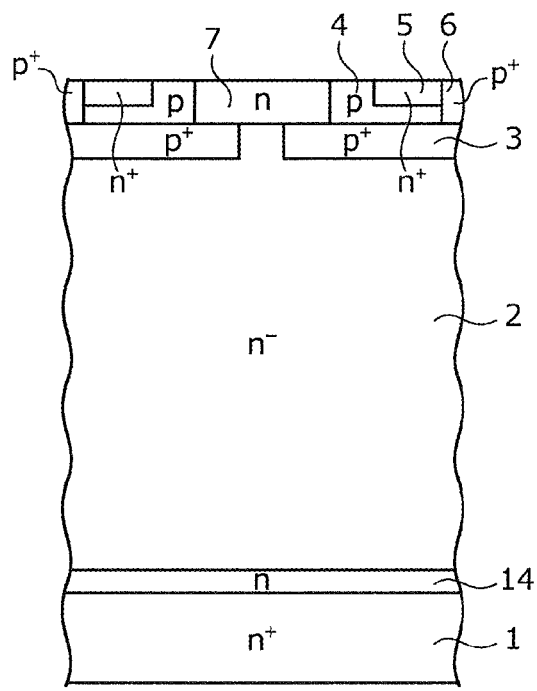
FIGS. 11A and 11B are cross-sectional views of a state during fabrication of the semiconductor device according to the first embodiment.
Figure 11B:
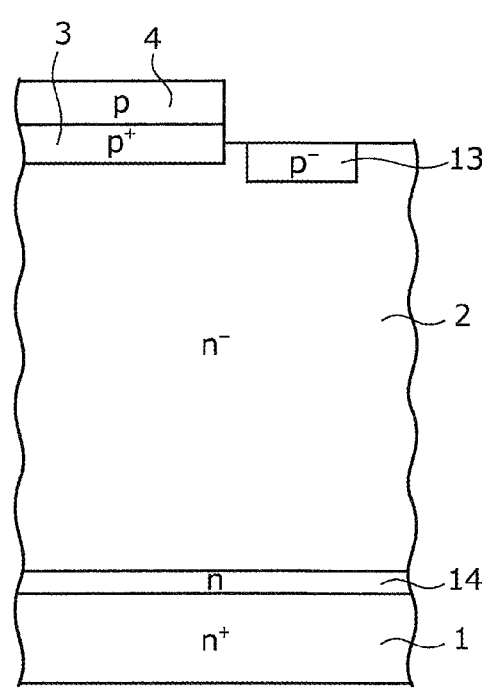

As depicted in FIGS. 11A and 11B, the JTE structure 13 is formed by ion implantation in the edge termination structure region. For example, ions of aluminum are implanted into a surface layer of the n⁻ drift layer 2 exposed by removing the p-base layer 4 by etching, to selectively form the P⁻ region 21. The dosage of the ion implantation may be $6.0 \times 10^{13}$ cm⁻², for example. In this case, in the portion 100c under the gate pad and the portions 100d under the gate runners in the vicinity of the boundary between the active region 100a and the edge termination structure region, the P⁻ region 21 is formed to be in contact with one or both of the P⁺ region 3 and the P⁺ region 33. On the other hand, on the boundary between the active region 100a and the edge termination structure region, i.e., in the portions other than the portion 100c under the gate pad and the portions 100d under the gate runners, the P⁻ region 21 is formed at a position separated by about 0.2 μm from the P⁺ region 3 and the p-base layer 4.

The p⁻⁻ region 22 in contact with the p⁻ region 21 is then selectively formed on the outside of the P⁻ region 21 by ion implantation. In this ion implantation, for example, aluminum may be used as a dopant and the dosage may be set lower than the dosage at the time of formation of the P⁻ region 21 to, for example, $1.0 \times 10^{13}$ cm⁻². As is the case with the P⁻ region 21, the P⁻⁻ region 22 may be formed to be in contact with one or both of the P⁺ region 3 and the P⁺ region 33 in the portion 100c under the gate pad and the portions 100d under the gate runners in the vicinity of the boundary between the active region and the edge termination structure region. Activation annealing is then performed. The activation annealing may be performed at a temperature of 1620 degrees C. for two minutes, for example.

Figure 12A:
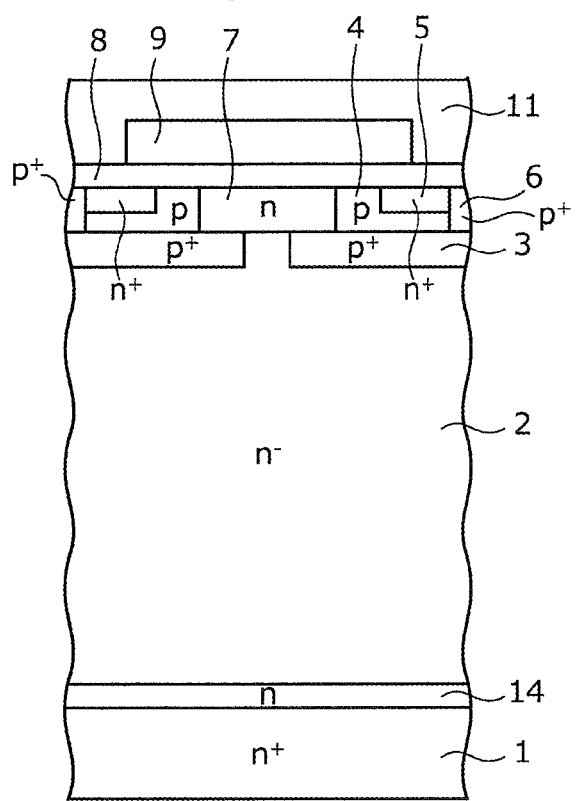
FIGS. 12A and 12B are cross-sectional views of a state during fabrication of the semiconductor device according to the first embodiment.
Figure 12B:
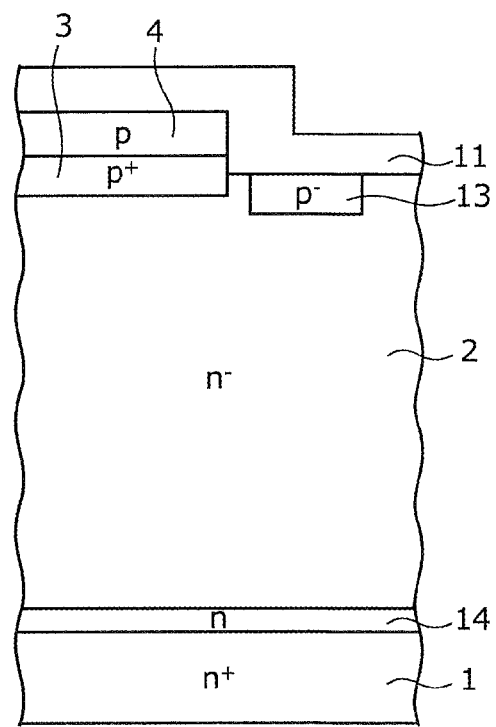

As depicted in FIGS. 12A and 12B, a SiC semiconductor exposed on the front surface side of the n⁺ semiconductor substrate 1 is thermally-oxidized to form the gate insulating film 8 with a thickness of 100 nm. Annealing is performed at a temperature of about 1000 degree C. in a hydrogen ($H_2$) atmosphere. A polycrystalline silicon layer doped with phosphorus (P) is formed as the gate electrode 9. After patterning of the gate electrode 9, a 1.0 μm-thick film of phosphorus glass is formed as the interlayer insulation film 11. After patterning the interlayer insulation film 11 to form a contact hole, heat treatment is performed.

A film of aluminum containing silicon (Si) at a rate of 1% (Al—Si, hereinafter referred to as aluminum silicon) is formed by sputtering to, for example, a thickness of 5 μm, on the interlayer insulation film 11 of the active region such that the film is embedded in the contact hole, to form the source electrode 10. After a nickel (Ni) film is embedded in the contact hole, an aluminum silicon film may be deposited to form the source electrode 10 formed by laminating the nickel film and the aluminum silicon film.

After a nickel film is formed on the back surface of the n+ semiconductor substrate 1 and heat-treated at a temperature of 970 degrees C., a titanium (Ti) film, a nickel film, and a gold (Au) film are sequentially formed on the nickel film to form a back surface electrode 15 formed by laminating the nickel film, the titanium film, the nickel film, and the gold film. Subsequently, the front surface device structure is covered by the passivation film 12 to complete the SiC-MOSFET depicted in FIGS. 1A and 1B.

A test was performed for a relationship between ion implantation concentration variation of the P⁻ region 21 and the p⁻⁻ region 22 making up the JTE structure and a breakdown voltage. FIG. 13 is a table of breakdown voltage characteristics of the SiC-MOSFET according to the first embodiment. FIG. 14 is a table of breakdown voltage characteristics of a SiC-MOSFET of a comparison example. First, a SiC-MOSFET was produced according to the method of fabricating the semiconductor device of the first embodiment under the condition exemplified in the method of fabricating the semiconductor device of the first embodiment (hereinafter referred to as Example 1). Therefore, in Example 1, the p⁻ region 22 is in contact with the end portions of the P⁺ region 3 and the P⁺ region 3 in the portion 100c under the gate pad and the portions 100d under the gate runners in the vicinity of the boundary between the active region and the edge termination structure region.

To test a reduction in breakdown voltage due to ion implantation concentration variation of the P⁻ region 21 and the p⁻⁻ region 22, the dosages (hereinafter referred to as reference dosages) of the P⁻ region 21 and the p⁻⁻ region 22 exemplified in the method of fabricating the semiconductor device of the first embodiment were changed by ±50% to produce multiple devices of Example 1. In particular, the reference dosages of the P⁻ region 21 and the p⁻⁻ region 22 are $6.0 \times 10^{13}$ cm⁻² and $1.0 \times 10^{13}$ cm⁻², respectively. The reference dosages are dosages preferable for producing a SiC-MOSFET having a breakdown voltage of 1400 V or higher, for example.

For comparison, a SiC-MOSFET was produced such that an entire inner periphery of a first JTE region (P⁻ region) comes into contact with the P⁺ region 3 and the p-base layer 4 (hereinafter referred to as a comparison example). Multiple devices of the comparison example were produced in the same way by variously changing the dosage within the same range as the P⁻ region 21 and the p⁻⁻ region 22 of Example 1 so as to test a reduction in breakdown voltage due to ion implantation concentration variation of the first JTE region and the second JTE region (p⁻ region).

For example, the dosage of the ion implantation for forming the P⁻ region 21 (first JTE region) was changed within a range of $3.0 \times 10^{13}$ cm⁻² to $1.2 \times 10^{14}$ cm⁻². The dosage of the ion implantation for forming the p⁻⁻ region 22 (second JTE region) was variously changed within a range of $4.0 \times 10^{12}$ cm⁻² to $2.0 \times 10^{13}$ cm⁻² such that the dosage becomes lower than the dosage of the ion implantation for forming the first JTE region. In both Example 1 and the comparison example, the die size was 3 mm×3 mm with an area of the active region of 5.73 mm², and rated current was 25 A.

Breakdown voltage measurement results of the produced devices of Example 1 and the comparison example are depicted in FIGS. 13 and 14. In FIG. 13, the P⁻ region 21 and the p⁻⁻ region 22 are described as the first JTE region and the second JTE region, respectively.

From the results depicted in FIGS. 13 and 14, it is confirmed for both Example 1 and the comparison example that the breakdown voltages at the reference dosages are 1450 V and 1451 V, respectively, and that no breakdown voltage variation occurs. It is confirmed in Example 1 that even when the P⁻ region 21 (first JTE region) and the p⁻⁻ region 22 (second JTE region) are created with respective dosages different from the reference dosages, the breakdown voltage is not changed from 1450 V. In contrast, it is confirmed in the comparison example that, if the first JTE region and the second JTE region are created with respective dosages different from the reference dosages, when the dosages are changed by 20% from the reference dosages, the breakdown voltage is reduced by about 100 V from the breakdown voltage of 1451 V at the reference dosages.

The breakdown voltage is reduced in the comparison example particularly because the first JTE region and the second JTE region are formed at impurity concentrations by the ion implantation method and, therefore, the impurity concentrations easily vary in the regions. Thus, it is confirmed that a sufficient breakdown voltage can be acquired regardless of deviation of the impurity concentrations of the first JTE region and the second JTE region by forming the first JTE region such that the first JTE region comes in to contact with the end portions of the P+ region 3 and the P+ region 33 only in the portion 100c under the gate pad and the portions 100d under the gate runners as in Example 1.

Figure 15:
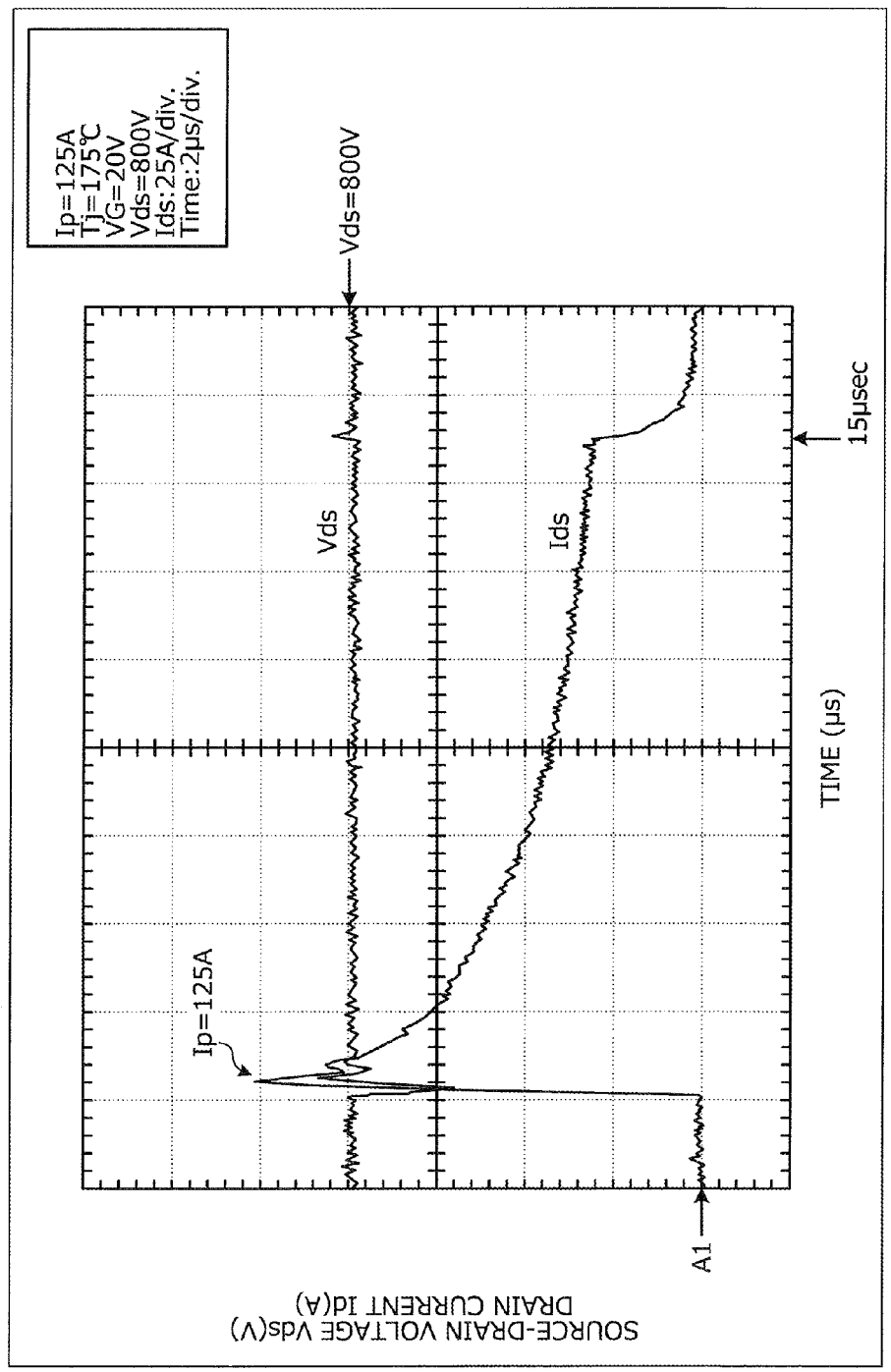
FIG. 15 is waveforms of the short-circuit capability of the SiC-MOSFET according to the first embodiment.
Figure 16:
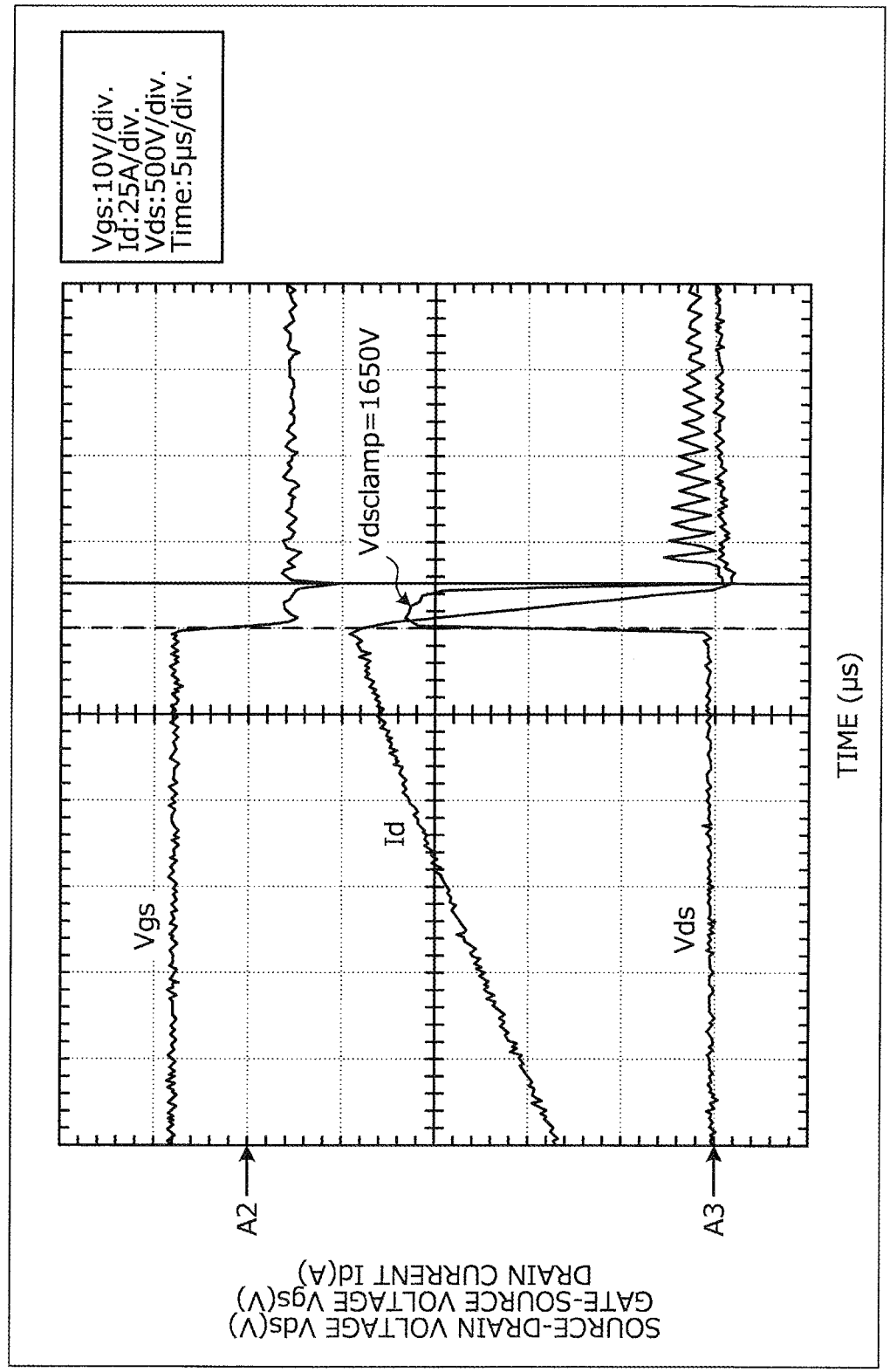
FIG. 16 is waveforms of the turn-off capability of the SiC-MOSFET according to the first embodiment.
Figure 17:
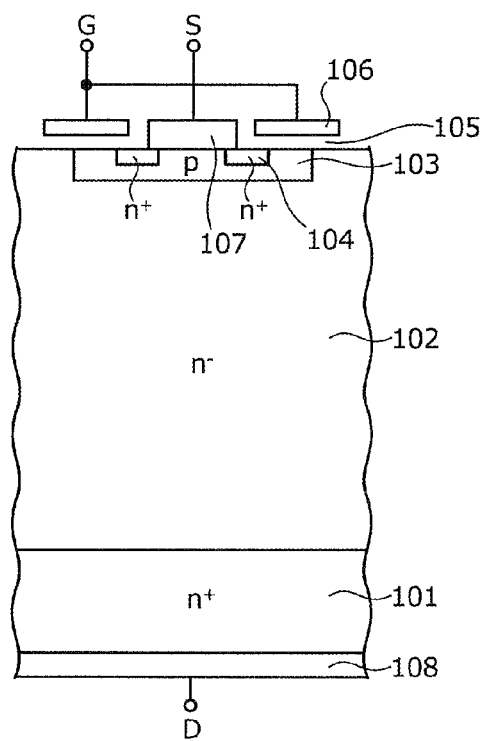
FIG. 17 is a cross-sectional view of a configuration of a conventional MOSFET.

A test was performed for a short-circuit capability and a turn-off capability in the semiconductor device according to the present invention. FIG. 15 is waveforms of the short-circuit capability of the SiC-MOSFET according to the first embodiment. FIG. 16 is waveforms of the turn-off capability of the SiC-MOSFET according to the first embodiment. The short-circuit capability and the turn-off capability were measured for Example 1 produced under the conditions exemplified in the method of fabricating the semiconductor device according to the first embodiment.

In the measurement of the short-circuit capability, a source voltage Vcc was directly applied between the source and the drain to satisfy the source voltage Vcc=a source-drain voltage Vds, and a gate voltage Vg=20 V was applied to the gate electrode in this state to evaluate a time until destruction in μsec. FIG. 15 depicts a result of the measurement of the short-circuit capability of Example 1 when the Vcc applied between the source and the drain is 800 V and a temperature Tj of the semiconductor device at the start of the measurement is 175 degrees C.

Measurement waveforms depicted in FIG. 15 are a schematic of a waveform of the source-drain voltage Vds and a waveform of a drain current Id. In FIG. 15, the horizontal axis indicates time (s) and each square defined by dot-lines indicates 2 s (Time: 2 s/div.). The vertical axis indicates a current value of the drain current Id with a position indicted by an arrow A1 defined as the origin and each square defined by dot-lines indicates 25 A (Id: 25 A/div.). The vertical axis indicates a voltage value of the source-drain voltage Vds and the waveform of the source-drain voltage Vds indicates 800 V, which is substantially the same as the Vcc. From the results depicted in FIG. 15, it was confirmed that the device was not destroyed even when the device conducted the maximum current Ip of 125 A, which is five times larger than the rated current of 25 A. It was also confirmed that the device was not destroyed after 15 sec from when the device was turned on (Id>0 A), and could be turned off (Id=0 A).

FIG. 16 depicts a result of the measurement of the turn-off capability of Example 1. Measurement waveforms depicted in FIG. 16 are a waveform of the gate-source voltage Vgs, a waveform of the source-drain voltage Vds, and a waveform of a drain current Id. In FIG. 16, the horizontal axis indicates time (μs) and each square defined by dot-lines indicates 5 μs (Time: 5 μs/div.). The vertical axis indicates the gate-source voltage Vgs, the source-drain voltage Vds, or the drain current Id. The waveform of the gate-source voltage Vgs is represented by using a position indicted by an arrow A2 as the origin and each square defined by dot-lines indicates 10 A (Vgs: 10 A/div.). The waveform of the source-drain voltage Vds is represented by using an arrow A3 as the origin and each square defined by dot-lines indicates 50 V (Vds: 50 V/div.). The waveform of the drain current Id is represented by using the arrow A3 as the origin and each square defined by dot-lines indicates 25 A (Id: 25 A/div.).

From the results depicted in FIG. 16, at the time of turn-off of Example 1, i.e., when the gate-source voltage Vgs was changed from 10 V to 0 V or less, the source-drain voltage Vds was clamped at 1650 V (Vdsclamp of FIG. 16). It was confirmed that the drain current Id=100 A (four times larger than the rated current of 25 A) could be turned off under a temperature environment of 150 degree C. without destruction of Example 1. Therefore, it was confirmed that extremely high avalanche capability can be acquired from Example 1 in terms of not only static breakdown voltage characteristics but also dynamic one such as a short-circuit capability and a turn-off capability without being affected by process variations.

In Example 1, it was confirmed that the same favorable characteristics as Example 1 were exhibited when the semiconductor device according to the first embodiment was produced on a (000-1) plane that is the principal plane of the n+ semiconductor substrate 1 having an off-angle of about 0, 2, 8, or 10 degrees in a <11-20> direction, for example.

Second Embodiment

A semiconductor device according to a second embodiment is different from the semiconductor device according to the first embodiment in that the principal plane of the n+ semiconductor substrate 1 is a (0001) plane having an off-angle of about 4 degrees in a <1120> direction, for example. The other constituent elements of the semiconductor device according to the second embodiment are the same as the semiconductor device according to the first embodiment. The method of fabricating the semiconductor device according to the second embodiment is the same as the method of fabricating the semiconductor device according to the first embodiment.

A SiC-MOSFET was produced according to the method of fabricating the semiconductor device of the second embodiment described above, under the condition described in the method of fabricating the semiconductor device of the second embodiment (hereinafter referred to as Example 2). Tests were performed for the breakdown voltage characteristics, the short-circuit capability, and the turn-off capability of devices as is the case with Example 1. As a result, it was confirmed that Example 2 exhibited substantially the same characteristics as Example 1.

In Example 2, it was confirmed that the same favorable characteristics as Example 2 were exhibited when the semiconductor device according to the second embodiment was produced on a (0001) plane that is the principal plane of the n+ semiconductor substrate 1 having an off-angle of about 0, 2, 8, or 10 degrees in a <1120> direction, for example.

Third Embodiment

A semiconductor device according to a third embodiment is different from the semiconductor device according to the first embodiment in that the p-base layers (first second-conductivity type semiconductor region) are selectively formed in the surface layer of the n− drift layer 2 instead of the p+ regions 3. The p-base layers 4 are selectively formed by ion implantation in the surface layer of the n− drift layer 2. Therefore, in the semiconductor device according to the third embodiment, the p+ regions 3 and the n-well region 7 are not disposed. The other constituent elements of the semiconductor device according to the third embodiment are the same as the semiconductor device according to the first embodiment.

The method of fabricating the semiconductor device according to the third embodiment will be described. As is the case with the semiconductor device according to the first embodiment, the n$^+$ semiconductor substrate 1 having the n-layer 14 formed on the front surface is prepared and the n$^-$ drift layer 2 is epitaxially grown on the n-layer 14 of the n$^+$ semiconductor substrate 1. The P-base layers 4 are selectively formed to, for example, a depth of about 0.5 μm, in the surface layer of the n$^-$ drift layer 2 of the active region by ion implantation. In this ion implantation, for example, aluminum may be used as a dopant and the dosage may be set such that an impurity concentration of $1.0 \times 10^{16}$ cm$^{-3}$ is achieved in the P-base layers 4. A width of the P-base layer 4 in the direction of alignment of the multiple P-base layers 4 may be about 13 μm, for example.

As is the case with the first embodiment, the n$^+$ source regions 5 and the P$^+$ contact regions 6 are respectively selectively formed by ion implantation in the surface layers of the p-base layers 4. The activation annealing is performed under the same condition as the first embodiment. The P$^-$ region 21 and the p$^{--}$ region 22 are selectively formed in the surface layer of the n$^-$ drift layer 2 outside the p-base layers 4 in the same way as the first embodiment. The activation annealing is performed under the same condition as the first embodiment. Subsequently, as is the case with the first embodiment, the gate insulating film 8, the gate electrode 9, the interlayer insulation film 11, the source electrode 10, the back surface electrode 15, and the passivation film 12 are sequentially formed to complete the semiconductor device according to the third embodiment.

A test was performed for a relationship between ion implantation concentration variation of the P$^-$ region 21 and the p$^{--}$ region 22 making up the JTE structure and a breakdown voltage. First, a SiC-MOSFET was produced according to the method of fabricating the semiconductor device of the third embodiment described above, under the condition exemplified in the method of fabricating the semiconductor device of the third embodiment (hereinafter referred to as Example 3). The dosages were changed within the same range as the P$^-$ region 21 and the p$^{--}$ region 22 of Example 1 to produce multiple devices of Example 3. The other conditions were the same as Example 1.

As a result, it was confirmed that Example 3 exhibited substantially the same breakdown voltage characteristics as Example 1. It was also confirmed that the device was not destroyed even when the device conducted the maximum current of 125 A, which is five times larger than the rated current of 25 A, and that the device was not destroyed after 15 μsec. It was also confirmed in Example 3 that the source-drain voltage was clamped at 1610 V and that 100 A (four times larger than the rated current of 25 A) could be turned off under an ambient temperature of 150 degree C. without destruction. Therefore, it was confirmed that extremely high avalanche capability can be acquired from Example 3 as is the case with Example 1 in terms of not only static breakdown voltage characteristics but also dynamic one such as the short-circuit capability and the turn-off capability without being affected by process variations.

In Example 3, it was confirmed that the same favorable characteristics as Example 3 were exhibited when the semiconductor device according to the third embodiment was produced on a (000-1) plane that is the principal plane of the n$^+$ semiconductor substrate 1 having an off-angle of about 0, 2, 8, or 10 degrees in a <11-20> direction, for example.

Fourth Embodiment

A semiconductor device according to a fourth embodiment is different from the semiconductor device according to the third embodiment in that the principal plane of the n$^+$ semiconductor substrate 1 is a (0001) plane having an off-angle of about 4 degrees in a <1120> direction, for example. The other constituent elements of the semiconductor device according to the fourth embodiment are the same as the semiconductor device according to the third embodiment. The method of fabricating the semiconductor device according to the fourth embodiment is the same as the method of fabricating the semiconductor device according to the third embodiment.

A SiC-MOSFET was produced according to the method of fabricating the semiconductor device of the fourth embodiment described above, under the condition described in the method of fabricating the semiconductor device of the fourth embodiment (hereinafter referred to as Example 4). Tests were performed for the breakdown voltage characteristics, the short-circuit capability, and the turn-off capability of devices as is the case with Example 3. As a result, it was confirmed that Example 4 exhibited substantially the same characteristics as Example 3.

In Example 4, it was confirmed that the same favorable characteristics as Example 4 were exhibited when the semiconductor device according to the fourth embodiment was produced on a (0001) plane that is the principal plane of the n$^+$ semiconductor substrate 1 having an off-angle of about 0, 2, 8, or 10 degrees in a <1120> direction, for example.

As described above, according to the present invention, since the p$^-$ region (first JTE region) making up the JTE structure is brought into contact with the p$^+$ region or the p$^+$ region of the active region, or the both regions, only in the portions under the gate pad and under the gate runners in the vicinity of the boundary between the active region and the edge termination structure region, the high breakdown voltage characteristics can stably be acquired without effect on the breakdown voltage from impurity concentration and structure of the p$^+$ region and the p-base layer of the active region regardless of variations in impurity concentration of the first JTE region and the second JTE region making up the JTE structure. Therefore, even if the breakdown voltage determined by the JTE structure is reduced due to variations in impurity concentration of the first JTE region and the second JTE region, the breakdown voltage can be determined by p-n junction of the p$^+$ region and the p-base layer of the active region with the n$^-$ drift layer. Therefore, the breakdown voltage of the entire device can be maintained in a high breakdown voltage state without being affected by device fabrication process variations, and the semiconductor device can be provided that has the device structure stably exhibiting the high breakdown voltage characteristics.

According to the present invention, since the p-base layer is formed by epitaxial growth, the surface of the p-base layer can be made substantially flat almost without surface roughness and, therefore, the channel mobility can be made extremely large in a MOS structure portion made up of the p-base layer, the gate insulation film, and the gate electrode. As a result, ON-resistance can be made further smaller. According to the present invention, even when silicon carbide is used as a semiconductor material, the principal plane of the n-type semiconductor substrate can be set to a plane parallel to the (000-1) plane, a plane tilted by 10 degrees or less relative to the (000-1) plane, a plane parallel to the (0001) plane, or a plane tilted by 10 degrees or less relative to the (0001) plane, so as to reduce the interface state density at the interface between the gate insulation film and the silicon carbide semiconductor. As a result, the channel mobility can further be improved in the MOS structure portion. Therefore, extremely low ON-resistance can be achieved.

Although a MOSFET is taken as an example in the description, the present invention is not limited to the embodiments described above and is applicable to IGBTs, Schottky barrier diodes (SBDs), and PiN diodes. For example, if the present invention is applied to IGBTs, a $p^+$ semiconductor substrate may be used instead of the $n^+$ semiconductor substrate. If the present invention is applied to IGBTs, Schottky barrier diodes (SBDs), and PiN diodes, the p-type region electrically connected to the input electrode and the $p^-$ region (first JTE region) making up the JTE structure may be connected only under the gate pad and under the gate runners.

Although the first conductivity type is the n-type and the second conductivity type is the p-type in the present invention, the present invention is implemented in the same way even when the first conductivity type is the p-type while the second conductivity type is the n-type. Although the case of using silicon carbide as a semiconductor material is taken as an example in the description, this is not a limitation of the present invention, and a semiconductor material having a band gap wider than silicon (wide band gap semiconductor) other than silicon carbide may be used, or silicon may be used.

INDUSTRIAL APPLICABILITY

As described above, the semiconductor device according to the present invention is useful for a power semiconductor device controlling high breakdown voltage and high current and is particularly suitable for a vertical high-voltage semiconductor device produced by using silicon carbide, which is one of the wide band gap materials, as a semiconductor material.

EXPLANATIONS OF LETTERS OR NUMERALS

1 $N^+$ semiconductor substrate
2 $N^-$ drift layer
3 $P^+$ region
4 p-base layer
5 $N^+$ source region
6 P+ contact region
7 n-well region
8 gate insulation film
9 gate electrode
10 source electrode
11 interlayer insulation film
12 passivation film
13 JTE structure
100a active region
100b edge termination structure region

The invention claimed is:
1. A semiconductor device comprising:
an active region disposed on a semiconductor substrate; and
an edge termination structure region disposed on the semiconductor substrate to surround the active region, wherein
the active region includes
a first-conductivity-type semiconductor layer disposed on the semiconductor substrate and having an impurity concentration lower than the semiconductor substrate,
a first second-conductivity-type semiconductor region selectively disposed in a surface layer of the first-conductivity-type semiconductor layer, to reach a boundary between the active region and the edge termination structure region, the surface layer of the first-conductivity-type semiconductor layer being on a side opposite to the semiconductor substrate,
a first electrode electrically connected to the first second-conductivity-type semiconductor region,
a front surface device structure made up of at least the first second-conductivity-type semiconductor region and the first electrode,
a second electrode disposed on a back surface of the semiconductor substrate, and
a second second-conductivity-type semiconductor region disposed in a region excluding a region in which the front surface device structure is disposed, and formed to be in contact with the first second-conductivity-type semiconductor region and up to a boundary position between the active region and the edge termination structure region,
the edge termination structure region includes
a plurality of third second-conductivity-type semiconductor regions disposed in the surface layer of the first-conductivity-type semiconductor layer, separately from the boundary between the active region and the edge termination structure region completely and having an impurity concentration lower than the first second-conductivity-type semiconductor region, a surface layer of the plurality of third second-conductivity-type semiconductor regions being on the side opposite to the semiconductor substrate,
the second second-conductivity-type semiconductor region is in contact with the first electrode,
among the plurality of the third second-conductivity-type semiconductor regions, at least the third second-conductivity-type semiconductor region closest to the active region is electrically connected to the second second-conductivity-type semiconductor region under a gate runner disposed above the semiconductor substrate in the vicinity of the boundary between the active region and the edge termination structure region, and
the second second-conductivity-type semiconductor region is formed directly on the first second-conductivity-type semiconductor region in a depth direction and on the side opposite to a side of the first-conductivity-type semiconductor layer.

2. The semiconductor device of claim 1, wherein the front surface device structure is further made up of:
a second-conductivity-type semiconductor layer disposed on the first-conductivity-type semiconductor layer and the first second-conductivity-type semiconductor region, and having an impurity concentration lower than the first second-conductivity-type semiconductor region,
a fourth first-conductivity-type semiconductor region selectively formed in a surface layer of the second-conductivity-type semiconductor layer, the surface layer of the second-conductivity-type semiconductor layer being on a side opposite to the first second-conductivity-type semiconductor region, a fifth first-conductivity-type semiconductor region penetrating the second-conductivity-type semiconductor layer in the depth direction, to the first-conductivity-type semiconductor layer, a gate electrode disposed via a gate insulation film on a surface of a portion of the second-conductivity-type semiconductor layer, the portion of the second-conductivity-type semiconductor layer being interposed between the fourth first-conductivity-type semiconductor region and the fifth first-conductivity-type semiconductor region, and the first electrode is in contact with the fourth first-conductivity-type semiconductor region and the second-conductivity-type semiconductor layer.

3. The semiconductor device of claim 2, wherein the plurality of the third second-conductivity-type semiconductor regions is disposed separately from the first second-conductivity-type semiconductor region and the second-conductivity-type semiconductor layer.

4. The semiconductor device of claim 2, wherein among the plurality of the third second-conductivity-type semiconductor regions, at least the third second-conductivity-type semiconductor region closest to the active region has an end portion that faces the active region and is separated by a distance of 20 µm or less from an end portion of the second-conductivity-type semiconductor layer, the end portion of the second-conductivity-type semiconductor layer facing the edge termination structure region.

5. The semiconductor device of claim 2, wherein the second-conductivity-type semiconductor layer is an epitaxial layer formed by an epitaxial growth method.

6. The semiconductor device of claim 2, wherein the first second-conductivity-type semiconductor region, the fourth first-conductivity-type semiconductor region, and the fifth first-conductivity-type semiconductor region are impurity diffusion regions formed by an ion implantation method.

7. The semiconductor device of claim 1, wherein among the plurality of the third second-conductivity-type semiconductor regions, at least the third second-conductivity-type semiconductor region closest to the active region has an end portion that faces the active region and is separated by a distance of 20 µm or less from an end portion of the first second-conductivity-type semiconductor region, the end portion of the first second-conductivity-type semiconductor region facing the edge termination structure region.

8. The semiconductor device of claim 1, wherein the first-conductivity-type semiconductor layer is an epitaxial layer formed by an epitaxial growth method.

9. The semiconductor device of claim 1, wherein the semiconductor substrate is made of silicon carbide.

10. The semiconductor device of claim 1, wherein a front surface of the semiconductor substrate is parallel to a (000-1) plane or a plane tilted by 10 degrees or less relative to the (000-1) plane.

11. The semiconductor device of claim 1, wherein a front surface of the semiconductor substrate is parallel to a (0001) plane or a plane tilted by 10 degrees or less relative to the (0001) plane.

* * * * *